United States Patent
Chen et al.

(10) Patent No.: US 11,545,396 B2
(45) Date of Patent: Jan. 3, 2023

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Deyan Chen, Shanghai (CN); Mao Li, Shanghai (CN); Dae-Sub Jung, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/938,269

(22) Filed: Jul. 24, 2020

(65) Prior Publication Data

US 2021/0028065 A1   Jan. 28, 2021

(30) Foreign Application Priority Data

Jul. 25, 2019 (CN) .......................... 201910676160.0

(51) Int. Cl.
| | | |
|---|---|---|
| H01L 21/8234 | (2006.01) |
| H01L 29/66 | (2006.01) |
| H01L 27/088 | (2006.01) |
| H01L 29/06 | (2006.01) |
| H01L 29/78 | (2006.01) |

(52) U.S. Cl.
CPC ........... *H01L 21/823431* (2013.01); *H01L 21/823412* (2013.01); *H01L 21/823481* (2013.01); *H01L 27/0886* (2013.01); *H01L 29/0653* (2013.01); *H01L 29/66674* (2013.01); *H01L 29/7817* (2013.01)

(58) Field of Classification Search
CPC combination set(s) only.
See application file for complete search history.

(56) References Cited

U.S. PATENT DOCUMENTS

| | | | |
|---|---|---|---|
| 9,570,580 B1* | 2/2017 | Chiang | H01L 21/823878 |
| 2009/0207667 A1* | 8/2009 | Park | G11C 8/14 |
| | | | 257/326 |
| 2016/0240650 A1* | 8/2016 | Chang | H01L 29/66795 |
| 2017/0256540 A1* | 9/2017 | Duriez | H01L 27/0886 |
| 2019/0088551 A1* | 3/2019 | Kim | H01L 29/6681 |
| 2019/0386118 A1* | 12/2019 | Chan | H01L 29/6653 |

\* cited by examiner

*Primary Examiner* — Moin M Rahman
*Assistant Examiner* — Mohammad A Rahman
(74) *Attorney, Agent, or Firm* — Anova Law Group, PLLC

(57) ABSTRACT

A method for forming a semiconductor structure includes providing a substrate, including a first region and a second region; forming a plurality of fin structures on the substrate; forming an isolation structure between adjacent fin structures; forming a mask layer over the substrate and the plurality of fin structures; forming an opening by removing a portion of the mask layer formed in the first region; removing a portion of the isolation structure exposed in the opening by using a remaining portion of the mask layer as a mask; removing the remaining portion of the mask layer; and forming a gate structure across the plurality of fin structures. The gate structure covers the first region.

11 Claims, 7 Drawing Sheets

SEMICONDUCTOR STRUCTURE AND METHOD FOR FORMING THE SAME

CROSS-REFERENCE TO RELATED APPLICATION

This application claims priority to Chinese Patent Application No. 201910676160.0, filed on Jul. 25, 2019, the entire content of which is incorporated herein by reference.

TECHNICAL FIELD

The present disclosure relates to the field of semiconductor manufacturing and, more particularly, relates to a semiconductor structure and a method for forming the same.

BACKGROUND

With development of semiconductor technology, power integrated circuit (PIC) is continuously used in many fields. Laterally double-diffused metal oxide semiconductor (LDMOS) transistors demonstrate characteristics of high operating voltage, simple process, and desirable processing compatibility with complementary metal-oxide semiconductor (CMOS) processes, and have thus been widely used as a power device in PICs.

Source-drain breakdown voltage (BVdss) and on-resistance (Ron) characteristics of power devices are essential for high-efficiency power circuit design. Generally, an LDMOS device requires a higher source-drain breakdown voltage and a lower on-resistance to improve the device performance. However, the on-resistance and the breakdown voltage of LDMOS devices are contradictory indicators. For example, when the on-resistance decreases, the breakdown voltage may also decrease, and vice versa.

Therefore, how to obtain a lowest possible on-resistance to reduce the conduction loss through reasonable designs while satisfying a certain breakdown voltage is an urgent problem to be solved. The disclosed semiconductor structures and fabrication methods thereof are directed to solve one or more problems set forth above and other problems in the art.

SUMMARY

To address above problems, embodiments and implementations of the present disclosure provide a semiconductor structure and a formation method thereof. Semiconductor device according to the present disclosure has a higher source-drain breakdown voltage (BVdss) and a lower on-resistance (Ron).

One aspect of the present disclosure provides a method for forming a semiconductor structure. The method includes providing a substrate, including a first region and a second region; forming a plurality of fin structures on the substrate; forming an isolation structure between adjacent fin structures; forming a mask layer over the substrate and the plurality of fin structures; forming an opening by removing a portion of the mask layer formed in the first region; removing a portion of the isolation structure exposed in the opening by using a remaining portion of the mask layer as a mask; removing the remaining portion of the mask layer; and forming a gate structure across the plurality of fin structures. The gate structure covers the first region.

Optionally, forming the isolation structure includes forming an isolation layer between adjacent fin structures with the top surface of the isolation layer higher than the top surfaces of the plurality of fin structures; performing a chemical mechanical polishing (CMP) process on the isolation layer until the surface top of the isolation layer is leveled with the top surfaces of the plurality of fin structures; and etching the isolation layer to form the isolation structure. The top surface of the isolation structure is lower than the top surfaces of the plurality of fin structures.

Optionally, the mask layer is made of a material including a silicon nitride layer or a photoresist layer.

Optionally, forming the mask layer includes a chemical vapor deposition (CVD) process.

Optionally, forming the opening by removing the portion of the mask layer formed in the first region includes forming a photoresist layer on the mask layer; forming a patterned photoresist layer from the photoresist layer by a photolithography process; removing a portion of the mask layer formed in the first region by an etching process using the patterned photoresist layer as an etch mask; and removing the patterned photoresist layer.

Optionally, removing the portion of the mask layer formed in the first region includes a dry etching process.

Optionally, removing the portion of the isolation structure exposed in the opening includes a dry etching process.

Optionally, an etching gas used in the dry etching process includes carbon tetrafluoride ($CF_4$), octafluorocyclobutane ($C_4F_8$), trifluoromethane ($CHF_3$), or a combination thereof.

Optionally, after forming the isolation structure on the substrate, the method further includes implanting first conductive ions into each fin structure and the substrate under the fin structure to form a drift region; and implanting second conductive ions into each fin structure and the substrate under the fin structure on one side of the drift region to form a first doped region.

Optionally, after forming the gate structure, the method further includes implanting the second conductive ions to each fin structure on a side of the gate structure, where the drift region is formed, to form a second doped region located on top of the drift region; and forming a source region and a drain region in each fin structure and respectively on two sides of the gate structure. Along the length direction of the fin structure, the second doped region is located between the gate structure and the drain region.

Optionally, a type of the first conductive ions is electrically opposite to a type of the second conductive ions.

Optionally, the first conductive ions are N-type ions, and the second conductive ions are P-type ions.

Optionally, forming the gate structure includes forming a gate oxide layer on top and sidewall surfaces of the plurality of fin structures; forming a gate material layer on the gate oxide layer; and performing a chemical mechanical polishing process on the gate material layer to form the gate structure.

Another aspect of the present disclosure provides a semiconductor structure. The semiconductor structure includes a substrate, including a first region and a second region; a plurality of fin structures, formed on the substrate; an isolation structure, formed on the substrate and located in the second region between adjacent fin structures; and a gate structure, formed across the plurality of fin structures and located in the first region.

Optionally, the substrate is made of silicon (Si), germanium (Ge), silicon germanium (SiGe), silicon carbide (SiC), silicon on insulator (SOI), insulator stacked silicon (SSOI), silicon germanium on insulator (SiGeOI), germanium on insulator (GeOI), or a combination thereof.

Optionally, the isolation structure is a shallow-trench isolation structure includes a shallow-trench isolation structure or a deep-trench isolation structure.

Optionally, the isolation structure is made of an insulating material.

Optionally, the gate structure includes a gate oxide layer formed on top and sidewall surfaces of the plurality of fin structures; and a gate layer formed on the gate oxide layer.

Optionally, the gate structure is a metal gate structure.

Optionally, the semiconductor structure further includes a drift region, formed in each fin structure and the substrate under the fin structure; a first doped region, formed in each fin structure and the substrate under the fin structure on a side of the drift region along an extending direction of the fin structure; and a second doped region, formed on a side of the gate structure where the drift region is formed. The second doped region is located on top of the drift region.

Compared to the existing technology, the technical solution of embodiments of the present disclosure includes the following advantages.

According to the disclosed fabrication method and semiconductor structure, the isolation structure is removed from the first region, and when forming the gate structure in a subsequent process, the material of the gate layer is formed to fill the space created by removing the isolation structure from the first region, thereby increasing the contact area between the gate structure and the fin structure. That is, the effective channel width is increased. The increase in the channel width makes the current path broader, and thus may improve the current passing ability and reduce the on-resistance of the semiconductor device. In addition, the current crowding problem may be avoided, thereby improving the reliability of the semiconductor device.

Further, the second conductive ions are implanted into each fin structure above the drift region to form a second doped region, and the type of the second conductive ions is opposite to the type of the first conductive ions which are implanted into the fin structure to form the drift region. In general, when the depletion region is formed wider, the breakdown voltage is higher. According to the fabrication method and the semiconductor structure, in addition to the depletion region formed between the first doped region and the drift region, by performing an extra ion implantation process to form the second doped region, a depletion region is also formed between the second doped region and the drift region. As such the depletion region formed in the drift region becomes wider, and thus the breakdown voltage of the semiconductor device may be improved.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION OF SOME EMBODIMENTS

Reference will now be made in detail to exemplary embodiments of the present disclosure, which are illustrated in the accompanying drawings. Wherever possible, the same reference numbers will be used throughout the drawings to refer to the same or like parts.

According to the existing technology, an LDMOS device requires a higher source-drain breakdown voltage and a lower on-resistance to improve the device performance. However, the on-resistance and the breakdown voltage of LDMOS devices are contradictory indicators. For example, when the on-resistance decreases, the breakdown voltage may also decrease, and vice versa.

Figure 1:
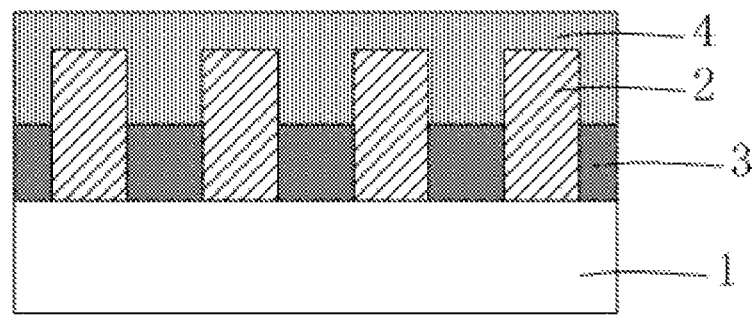
FIG. 1 illustrates a schematic view of a fin-type semiconductor structure.

FIG. 1 illustrates a schematic view of a fin-type semiconductor structure. Referring to FIG. 1, a fin-type LDMOS is fabricated. After a plurality of fin structures 2 are formed on a substrate 1, an isolation structure 3 is formed on the substrate 1 between adjacent fin structures 2 to provide electrical isolation for adjacent active devices. After an isolation structure 3 is formed, a gate structure 4 is formed on the substrate 1 across the fin structures 2, and the gate structure 4 covers the isolation structure 3.

In the semiconductor device described above, a portion of each fin structure 2 is covered by an isolation material. The subsequently formed gate structure 4 has a relatively small contact area with the fin structure 2, and the effective channel width is thus relatively narrow. During subsequent operation, the width of the channel that allows electrons flow through from the source to the drain is narrow, such that the on-resistance may be large, and the current passing ability may be weak. In addition, the narrow effective channel width may easily cause the current crowding problem, thereby degrading the reliability of the semiconductor device.

To ensure semiconductor devices having both high breakdown voltage and low on-resistance, the present disclosure provides a method for forming a semiconductor structure. According to the disclosed method, after an isolation structure is formed between adjacent fin structures, the isolation structure is removed from a first region of the substrate. A subsequently formed gate structure covers the first region. By filling the first region with a gate material, the contact area between the gate structure and the fin structure may be increased. That is, the effective channel width may be increased, thereby improving the current passing ability and reducing the on-resistance.

To make the above-described objectives, features, and beneficial effects of the present disclosure more comprehensible, specific embodiments of the present disclosure are described in detail with reference to the accompanying drawings.

Figure 13:
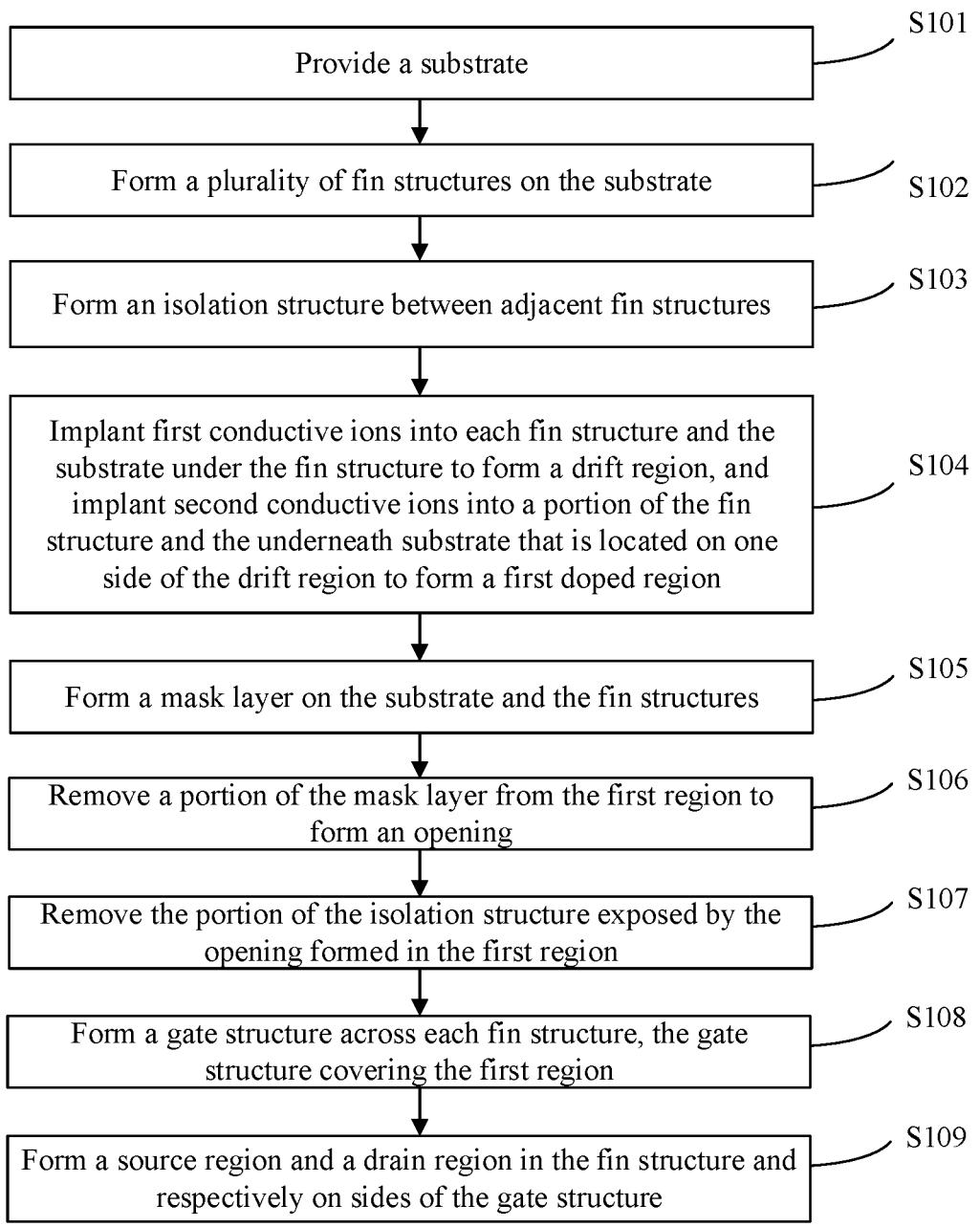
FIG. 13 illustrates a flowchart of an exemplary method for forming a semiconductor device according to some embodiments of the present disclosure.

FIG. 13 illustrates a flowchart of an exemplary method for forming a semiconductor device according to some embodiments of the present disclosure. FIG. 2 to FIG. 9 illustrate schematic structural views of semiconductor structures at certain stages of the exemplary method.

Figure 2:
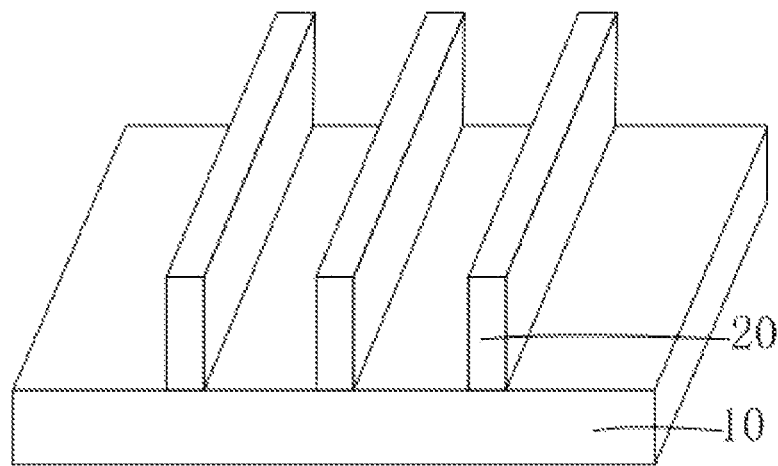
FIG. 2 to FIG. 9 illustrate schematic structural views of semiconductor structures at certain stages of an exemplary method according to some embodiments of the present disclosure.

Referring to FIG. 13, in S101, a substrate is provided. FIG. 2 illustrates a schematic view of a semiconductor structure according to some embodiments of the present disclosure.

Referring to FIG. 2, a substrate 10 is provided. The substrate 10 may include a first region and a second region.

The substrate 10 may be made of silicon (Si), germanium (Ge), silicon germanium (SiGe), silicon carbide (SiC), silicon on insulator (SOI), stacked silicon on insulator (SSOI), silicon germanium on insulator (SiGeOI), germanium on insulator (GeOI), or a combination thereof. In one embodiment, the substrate 10 may be a silicon substrate.

Further returning to FIG. 13, in S102, a plurality of fin structures may be formed on the substrate. The semiconductor structure shown in FIG. 2 also includes the plurality of fin structures formed on the substrate.

Referring to FIG. 2, a plurality of fin structures 20 may be formed on the substrate 10. In one embodiment, the method for forming the plurality of fin structures 20 may include forming a patterned mask layer (not shown) on the substrate 10. The patterned mask layer may correspond to the positions where the plurality of fin structures 20 need to be formed. The method for forming the plurality of fin structures 20 may further include using the patterned mask layer as an etch mask to etch through a partial thickness of the substrate 10 to form the plurality of discrete fin structures 20 on the substrate 10.

Figure 3:
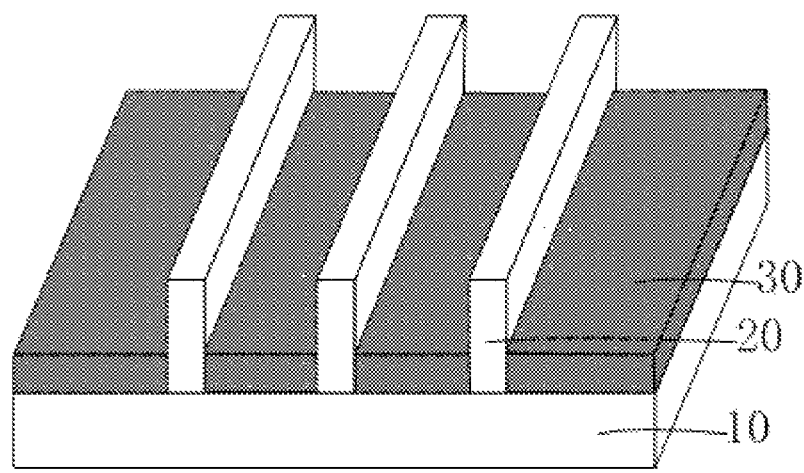

Further, returning to FIG. 13, in S103, an isolation structure may be formed on the substrate between adjacent fin structures. FIG. 3 illustrates a schematic view of a semiconductor structure according to some embodiments of the present disclosure.

Referring to FIG. 3, an isolation structure 30 may be formed on the substrate 10 between adjacent fin structures 20. In one embodiment, the isolation structure 30 may be a shallow-trench isolation structure. In other embodiments, the isolation structure may be any other types of isolation structure known to those skilled in the art.

In one embodiment, the process for forming the isolation structure 30 may include the following exemplary steps. An isolation layer (not shown) may be formed between adjacent fin structures 20. The top surface of the isolation layer may be higher than the top surfaces of the fin structures 20. A chemical mechanical polishing (CMP) process may be performed on the isolation layer until the top surface of the isolation layer is leveled with the top surfaces of the fin structures 20. Further, the isolation layer may be etched to form the isolation structure 30, such that the top surface of the formed isolation structure 30 may be lower than the top surfaces of the fin structures 20. In one embodiment, the isolation layer may be made of silicon dioxide ($SiO_2$).

It should be noted that after performing the CMP process on the isolation layer to make the top surface of the isolation layer leveled with the top surfaces of the fin structures 20, an ion implantation process may be performed on the fin structures 20 and the substrate 10 under the fin structures 20.

Figure 4:
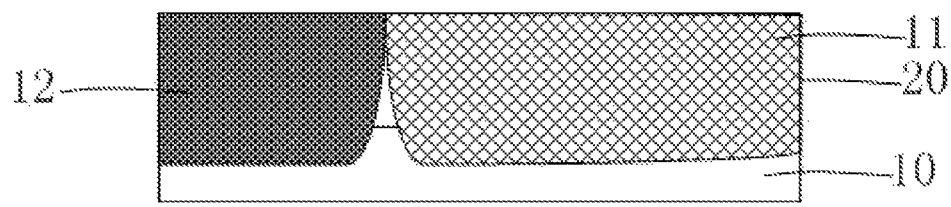

Referring to FIG. 13, in S104, first conductive ions may be implanted into each fin structure and the substrate under the fin structure to form a drift region, and after forming the drift region, second conductive ions may be implanted into a portion of the fin structure and the underneath substrate that is located on one side of the drift region to form a first doped region. FIG. 4 illustrates a schematic view of a semiconductor structure according to some embodiments of the present disclosure. Specifically, FIG. 4 illustrates a schematic cross-sectional view of the three-dimensional structure shown in FIG. 3 along the extending direction (e.g., the length direction) of a fin structure.

Referring to FIG. 4, first conductive ions may be implanted into each fin structure 20 and the substrate 10 under the fin structure 20 to form a drift region 11. After forming the drift region 11, second conductive ions may be implanted into a portion of the fin structure 20 and the underneath substrate 10 that is located on one side of the drift region 11 to form a first doped region 12. The first conductive ions and the second conductive ions may have opposite doping types.

In one embodiment, the first conductive ions may be N-type ions, and the N-type ions may include phosphorus ions, arsenic ions, antimony ions, or a combination thereof. The second conductive ions may be P-type ions, and the P-type ions may include boron ions, indium ions, gallium ions, or a combination thereof. In other embodiments, the first conductive ions may be P-type ions, and the second conductive ions may be N-type ions.

In one embodiment, the first conductive ions may be phosphorus ions. The implantation dose of the first conductive ions may be in a range of approximately 3E12 atoms/$cm^2$ to 7E12 atoms/$cm^2$, and the ion implantation energy may be in a range of approximately 50 keV to 150 keV. The second conductive ions may be boron ions. The implantation dose of the second conductive ions may be in a range of approximately 2E12 atoms/$cm^2$ to 4E12 atoms/$cm^2$, and the ion implantation energy may be in a range of approximately 5 keV to 50 keV.

Figure 5:
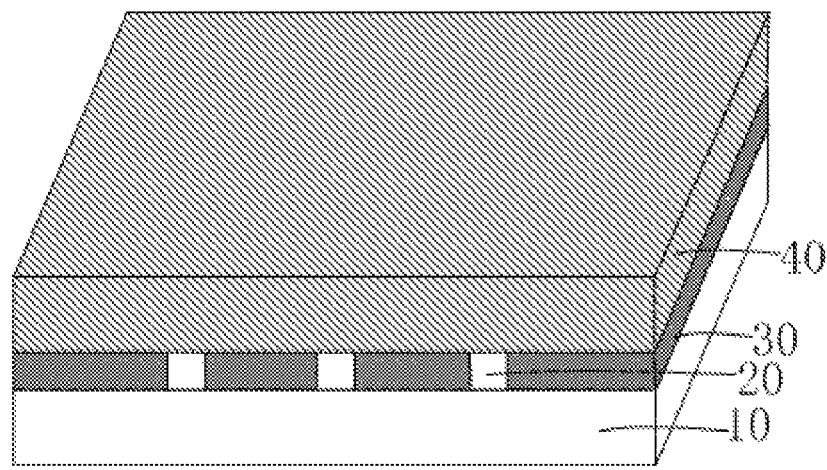

Further, returning to FIG. 13, in S105, after forming the isolation structure, a mask layer is formed on the substrate and the fin structures. FIG. 5 illustrates a schematic view of a semiconductor structure according to some embodiments of the present disclosure.

Referring to FIG. 5, after forming the isolation structure 30, a mask layer 40 may be formed on the substrate 10 and the fin structures 20. The mask layer 40 may cover the isolation structure 30 and the fin structures 20.

In one embodiment, the mask layer 40 may be made of silicon nitride ($SiN_x$). In other embodiments, the mask layer 40 may be a photoresist layer, and the photoresist layer may be mainly made of a mixture of resin, photosensitizer, and solvent. In one embodiment, the process for forming the mask layer 40 may be a chemical vapor deposition (CVD) process.

Figure 6:
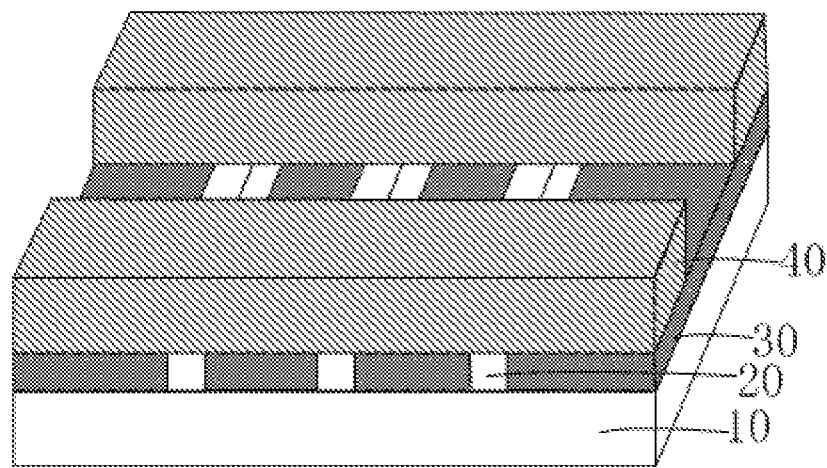

Further, returning to FIG. 13, in S106, after the mask layer is formed, a portion of the mask layer may be removed from the first region to form an opening. FIG. 6 illustrates a schematic view of a semiconductor structure according to some embodiments of the present disclosure.

Referring to FIG. 6, after the formation of the mask layer 40, the portion of the mask layer 40 formed in the first region may be removed to form an opening. In one embodiment, the process for forming the opening may include the following exemplary steps. A photoresist layer (not shown) may be formed on the mask layer. A patterned photoresist layer may be formed from the photoresist layer through a photolithography process. The portion of the mask layer 40 formed in the first region may then be removed by an etching process using the patterned photoresist layer as an etch mask. Further, the patterned photoresist layer may be removed to form the opening. In one embodiment, the process performed to etch the mask layer 40 may be a dry etching process.

Figure 7:
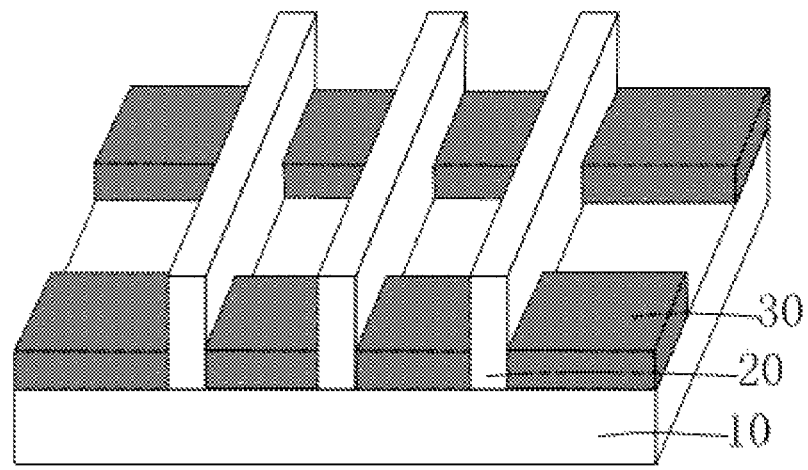

Further, returning to FIG. 13, in S107, the portion of the isolation structure exposed by the opening formed in the first region may be removed. FIG. 7 illustrates a schematic view of a semiconductor structure according to some embodiments of the present disclosure.

Referring to FIG. 7, the portion of the isolation structure 30 exposed by the opening formed in the first region may be removed. In one embodiment, the processing performed to remove the portion of the isolation structure 30 may be a dry etching process.

In one embodiment, the etching gas used in the dry etching process may include carbon tetrafluoride ($CF_4$), octafluorocyclobutane ($C_4F_8$), trifluoromethane ($CHF_3$), or a combination thereof.

When the portion of the isolation structure 30 formed in the first region is removed, after the gate structure is subsequently formed, the deposition depth of the gate material may be increased, such that the contact area between each fin structure 20 and the gate structure may also be increased. Therefore, the effective channel width may be increased. Increasing the effective channel width may be able to reduce the on-resistance of the device and improve the current passing ability. When electrons flow through the channel from the source to the drain, the current crowding problem may be avoided due to the increase in the cross section of the channel that the electrons can pass through, thereby improving the reliability of the semiconductor device.

Figure 8:
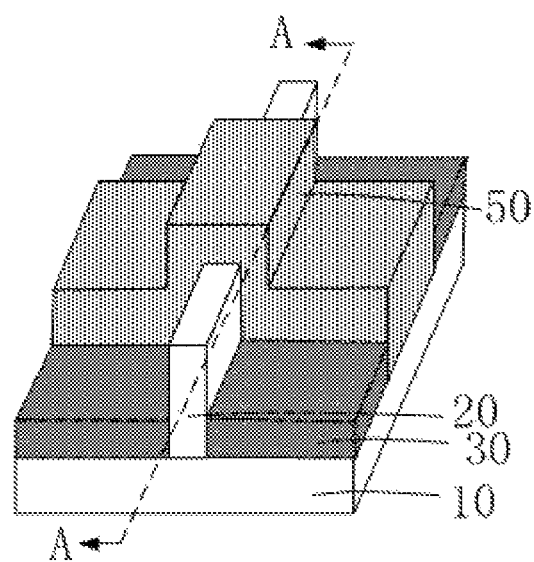

Further, returning to FIG. 13, in S108, after the mask layer is removed, a gate structure may be formed across each fin structure, and the gate structure may cover the first region. FIG. 8 illustrates a schematic view of a semiconductor structure according to some embodiments of the present disclosure. For illustrative purposes, only one fin structure is shown in FIG. 8. That is, the schematic structural view shown in FIG. 8 is developed from a portion of the semiconductor structure shown in FIG. 7.

Referring to FIG. 8, after the mask layer 40 (referring to FIG. 6) is removed, a gate structure 50 may be formed across each fin structure 20. The gate structure 50 may cover the first region.

In one embodiment, the gate structure 50 may include a gate oxide layer (not shown) formed on the substrate 10 and the plurality of fin structures 20, and a gate layer (not shown) formed on the gate oxide layer. The process for forming the gate structure 50 may include the following exemplary steps. A gate oxide layer (not shown) may be formed on the top and sidewall surfaces of the plurality of fin structures 20. A gate material layer (not shown) may be formed on the gate oxide layer. Further, a CM' process may be performed on the gate material layer to form the gate layer. In one embodiment, the gate structure 50 may be a metal gate structure.

Because the portion of the isolation structure 30 formed in the first region is removed, the gate material layer may fill the opening that is formed after the portion of the isolation structure 30 is removed from the first region. Therefore, the depth of side surfaces of the fin structure 20 covered by the gate structure 50 may be increased, and thus the contact area between the gate structure 50 and the fin structure 20 may also be increased. As such, the effective channel width may be increased, and accordingly, the on-resistance may be reduced.

Figure 9:
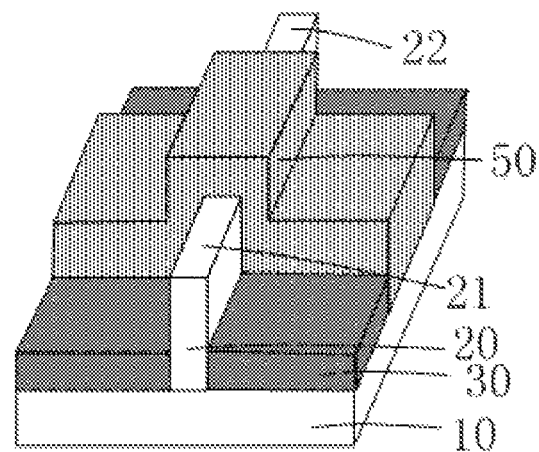

Returning to FIG. 13, in S109, after the gate structure is formed, a source region and a drain region may be formed in the fin structure and respectively on the two sides of the gate structure. FIG. 9 illustrates a schematic view of a semiconductor structure according to some embodiments of the present disclosure.

Referring to FIG. 9, after the gate structure 50 is formed, a source region 21 and a drain region 22 may be formed in the fin structure 20 and respectively on the two sides of the gate structure 50.

In one embodiment, the source region 21 may be formed in the first doped region 12 (referring to FIG. 4), and the drain region 22 may be formed in the drift region 11 (referring to FIG. 4).

Figure 10:
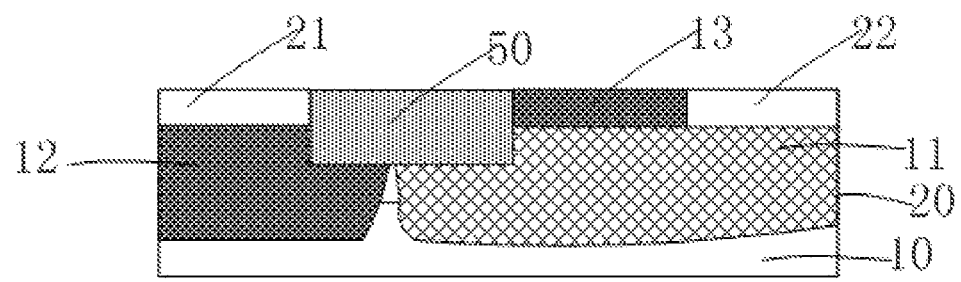
FIG. 10 illustrates a schematic structural view of a semiconductor structure at a certain stage of another exemplary method according to some embodiments of the present disclosure.

The present disclosure also provides another method for forming a semiconductor structure. FIG. 10 illustrates a schematic cross-sectional view of a semiconductor structure at a certain stage of the fabrication method. It should be noted that the method may be substantially the same as that described in the embodiments provided above. For example, providing substrate 10, forming the plurality of fin structures 20, forming the isolation structure 30, removing the portion of the isolation structure 30 formed in the first region, and forming the gate structure 50 may be the same as the corresponding exemplary steps described in the embodiments provided above, and the detailed description will not be repeated herein. The following description is focused on the difference in the exemplary fabrication steps.

The cross-sectional view schematically shown in FIG. 10 is a cross-sectional view of the semiconductor structure shown in FIG. 8 along the A-A direction. That is, a semiconductor structure formed at a certain stage of the disclosed method may be consistent with the semiconductor structure shown in FIG. 8.

In one embodiment, the process for implanting ions into each fin structure 20 and the substrate 10 under the fin structure 20 to form the drift region 11 and the first doped region 12 may also be the same as the corresponding process described in the embodiments provided above and will not be repeated here.

In one embodiment, after forming the gate structure, the second conductive ions may be implanted into each fin structure on one side of the gate structure to form a second doped region on top of the drift region. A schematic cross-sectional view of a corresponding semiconductor structure is shown in FIG. 10.

Referring to FIG. 10, after forming the gate structure 50, the second conductive ions may be implanted into each fin structure 20 on the side of the gate structure 50, where the drift region 11 is formed, to form a second doped region 13. The second doped region may be located on top of the drift region 11. In the length direction of the fin structure 20, the second doped region 13 may be located between the gate structure 50 and the drain region 22.

In one embodiment, the second doped region 13 may have the same doping type as the first doped region 12, but an opposite doping type as the drift region 11.

In one embodiment, the second conductive ions implanted to form the second doped region 13 may be boron ions, and the doping concentration in the second doped region 13 may be low. For example, the implantation dose of the second conductive ions in the second doped region 13 may be in a range of approximately $1E12$ atoms/cm$^2$ to $5E12$ atoms/cm$^2$.

The first doped region 12 may be located on one side of the drift region 11 along the extending direction of the fin structure 20. A depletion region may be formed in a contact region between the first doped region 12 and the drift region 11. When the depletion region is wider, the depletion region may be able to withstand a higher breakdown voltage. Thus, improving the breakdown voltage of a semiconductor device may be achieved by expanding the depletion region. Therefore, by performing an extra process to implant ions with an opposite type into the drift region 11 to form the second doped region 13, a second depletion region may be formed in the contact region between the second doped region 13 and the drift region 11, such that the width of the depletion region formed in the drift region 11 may be expanded, thereby improving the breakdown voltage of the semiconductor device.

Figure 11:
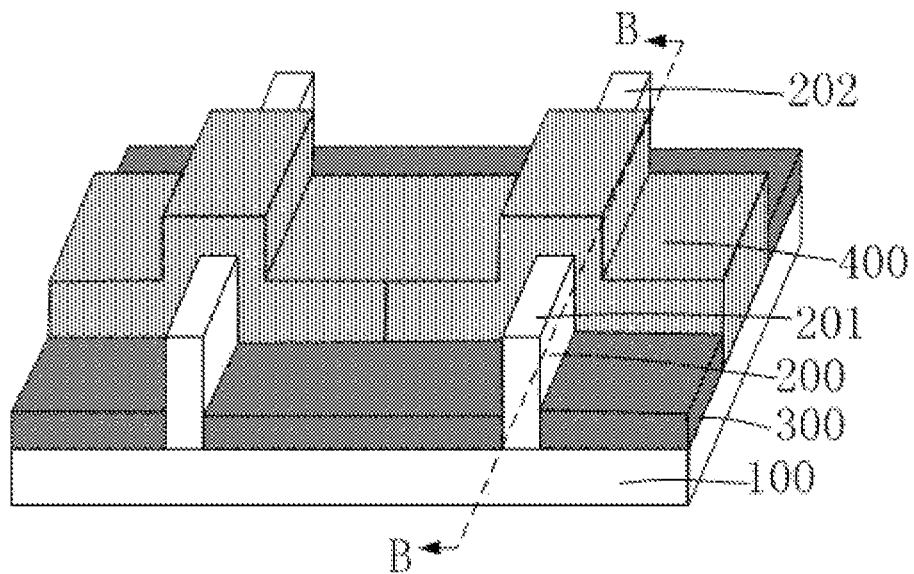
FIG. 11 illustrates a schematic three-dimensional structural view of an exemplary semiconductor structure according to some embodiments of the present disclosure.

The present disclosure also provides a semiconductor structure formed by the disclosed method. FIG. 11 illustrates a schematic three-dimensional structural view of an exemplary semiconductor structure according to some embodiments of the present disclosure, and FIG. 12 illustrates a schematic cross-sectional view of the semiconductor structure shown in FIG. 11 along a B-B direction (e.g., the extending/length direction of a fin structure).

Figure 12:
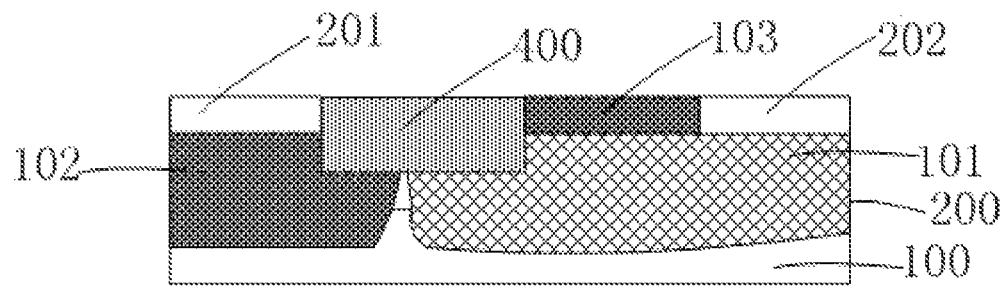
FIG. 12 illustrates a schematic cross-sectional view of the semiconductor structure shown in FIG. 11 along a B-B direction.

Referring to FIGS. 11-12, the semiconductor structure may include a substrate 100, including a first region and a second region; a plurality of fin structures 200 formed on the substrate 100; an isolation structure 300 formed on the substrate 100 and located in the second region between adjacent fin structures 200, a gate structure 400 formed across the plurality of fin structures 200 and located in the first region.

In one embodiment, the semiconductor structure may further include a source region 201 and a drain region 202. The source region 201 and the drain region 202 may be formed in each fin structure 200 and respectively on the two sides of the gate structure 400.

In one embodiment, the semiconductor structure may further include a drift region 101 formed in the fin structure 200 and the substrate 100 under the fin structure 200, a first doped region 102 formed in the fin structure 200 and the substrate 100 under the fin structure 200 on one side of the drift region 101 along the extending direction of fin structure 200, and a second doped region 103 formed on the side of the gate structure 400 where the drift region 101 is formed. The second doped region 103 may be located on top of the drift region 101. In the length direction of the fin structure 200, the second doped region 103 may be located between the gate structure 400 and the drain region 202.

The type of the doping ions in the drift region 101 may be opposite to the type of doping ions in the first doped region 102 and the second doped region 103. In one embodiment, ions doped in the drift region 101 may be N-type ions, and ions doped in the first doped region 102 and the second doped region 103 may be P-type ions.

According to the disclosed semiconductor structure and fabrication method, the depletion region in the drift region 101 is expanded such that the breakdown voltage of the semiconductor device is improved. In addition, the portion of the isolation structure 300 is removed from the first region, such that the contact area between the subsequently formed gate structure 400 and the fin structure 200 is increased, and thus the effective channel width is increased. Therefore, the area that the current flows through is increased, such that the on-resistance may be reduced. Therefore, the formed semiconductor device may not only have a high breakdown voltage, but also have a low on-resistance.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a semiconductor structure, comprising:
   providing a substrate, including a first region and a second region;
   forming a plurality of fin structures on the substrate;
   forming an isolation structure between adjacent fin structures;
   forming a mask layer over the substrate and the plurality of fin structures;
   forming an opening by removing a portion of the mask layer formed in the first region;
   removing a portion of the isolation structure exposed in the opening by using a remaining portion of the mask layer as a mask;
   removing the remaining portion of the mask layer;
   forming a gate structure across the plurality of fin structures, wherein the gate structure covers the first region,
   after forming the isolation structure on the substrate:
      implanting first conductive ions into each fin structure and the substrate under the fin structure to form a drift region; and
      implanting second conductive ions into each fin structure and the substrate under the fin structure on one side of the drift region to form a first doped region; and
   after forming the gate structure:
      implanting the second conductive ions to each fin structure on a side of the gate structure, where the drift region is formed, to form a second doped region, wherein the second doped region is located on top of the drift region; and
      forming a source region and a drain region in each fin structure and respectively on two sides of the gate structure, wherein along a length direction of the fin structure, the second doped region is located between the gate structure and the drain region.

2. The method according to claim 1, wherein:
   a type of the first conductive ions is electrically opposite to a type of the second conductive ions.

3. The method according to claim 2, wherein:
   the first conductive ions are N-type ions, and the second conductive ions are P-type ions.

4. The method according to claim 1, wherein forming the gate structure includes:
   forming a gate oxide layer on top and sidewall surfaces of the plurality of fin structures;
   forming a gate material layer on the gate oxide layer; and
   performing a CMP process on the gate material layer to form the gate structure.

5. The method according to claim 1, wherein forming the isolation structure includes:
   forming an isolation layer between adjacent fin structures, wherein a top surface of the isolation layer is higher than top surfaces of the plurality of fin structures;
   performing a chemical mechanical polishing (CMP) process on the isolation layer until the surface top of the isolation layer is leveled with the top surfaces of the plurality of fin structures; and
   etching the isolation layer to form the isolation structure, wherein a top surface of the isolation structure is lower than the top surfaces of the plurality of fin structures.

6. The method according to claim 1, wherein:
the mask layer is made of a material including a silicon nitride layer or a photoresist layer.

7. The method according to claim 6, wherein:
forming the mask layer includes a chemical vapor deposition (CVD) process.

8. The method according to claim 1, wherein forming the opening by removing the portion of the mask layer formed in the first region includes:
forming a photoresist layer on the mask layer;
forming a patterned photoresist layer from the photoresist layer by a photolithography process;
removing a portion of the mask layer formed in the first region by an etching process using the patterned photoresist layer as an etch mask; and
removing the patterned photoresist layer.

9. The method according to claim 8, wherein:
removing the portion of the mask layer formed in the first region includes a dry etching process.

10. The method according to claim 1, wherein:
removing the portion of the isolation structure exposed in the opening includes a dry etching process.

11. The method according to claim 10, wherein:
an etching gas used in the dry etching process includes carbon tetrafluoride ($CF_4$), octafluorocyclobutane ($C_4F_8$), trifluoromethane ($CHF_3$), or a combination thereof.

* * * * *